(12) United States Patent
Allaei (10) Patent No.: US 7,157,831 B2
(45) Date of Patent: Jan. 2, 2007

(54) ENERGY EFFICIENT VIBRATION DRIVEN MOTOR

(75) Inventor: Daryoush Allaei, Minnetonka, MN (US)

(73) Assignee: Quality Research, Development & Consulting, Inc., Chaska, MN (US)

( * ) Notice: Subject to any disclaimer, the term of this patent is extended or adjusted under 35 U.S.C. 154(b) by 106 days.

(21) Appl. No.: 10/955,448

(22) Filed: Sep. 30, 2004

(65) Prior Publication Data

US 2006/0066179 A1   Mar. 30, 2006

(51) Int. Cl.
*H01L 41/08* (2006.01)
(52) U.S. Cl. .................. 310/323.02; 310/328; 310/330
(58) Field of Classification Search ................ 310/321, 310/328, 323.02
See application file for complete search history.

(56) References Cited

U.S. PATENT DOCUMENTS

| | | | |
|---|---|---|---|
| 5,172,023 A | 12/1992 | Kawai | |
| 5,327,040 A | 7/1994 | Sumihara | |
| 5,438,229 A | 8/1995 | Ohtsuchi | |
| 5,448,129 A | 9/1995 | Sumihara | |
| 5,554,906 A | 9/1996 | Takagi | |
| 5,561,337 A * | 10/1996 | Toda | 310/323.02 |
| 5,726,520 A * | 3/1998 | Grahn | 310/328 |
| 6,046,526 A | 4/2000 | Maruyama | |
| 6,072,267 A | 6/2000 | Atsuta | |
| 6,093,994 A | 7/2000 | Petit | |
| 6,121,714 A | 9/2000 | Atsuta | |
| 6,323,581 B1 * | 11/2001 | Powell | 310/328 |
| 6,664,710 B1 * | 12/2003 | Gottlieb et al. | 310/323.02 |
| 6,768,245 B1 * | 7/2004 | Mock et al. | 310/323.02 |
| 6,882,084 B1 * | 4/2005 | Johansson et al. | 310/323.02 |

* cited by examiner

*Primary Examiner*—Mark Budd
(74) *Attorney, Agent, or Firm*—Leffert Jay & Polglaze, P.A.

(57) ABSTRACT

A motor includes a resonator and a vibration source coupled to the resonator. The vibration source can be a piezoelectric vibration source. A drive shaft is coupled to the resonator via a linkage. The vibration source(s) impart a vibration along the resonator such that a lateral displacement of the resonator is focused at a location coupled to the linkage. The lateral displacement is coupled to the drive shaft to provide rotational motion of the drive shaft.

6 Claims, 9 Drawing Sheets

ENERGY EFFICIENT VIBRATION DRIVEN MOTOR

FIELD OF THE INVENTION

The present invention relates generally to motors and in particular the present invention relates to vibration driven motors.

BACKGROUND OF THE INVENTION

Motors have been developed that convert a wide variety of energy input into mechanic output. For example, internal combustion engines use explosion of combustible fuel to generate output. Likewise, steam and electric motors have been developed. One type of electric motor converts electricity to ultrasonic vibration and then to mechanical movement. The ultrasonic motor has a driving force generated by exciting a flexual vibration in a vibrating body comprising a piezoelectric element.

Figure 1:
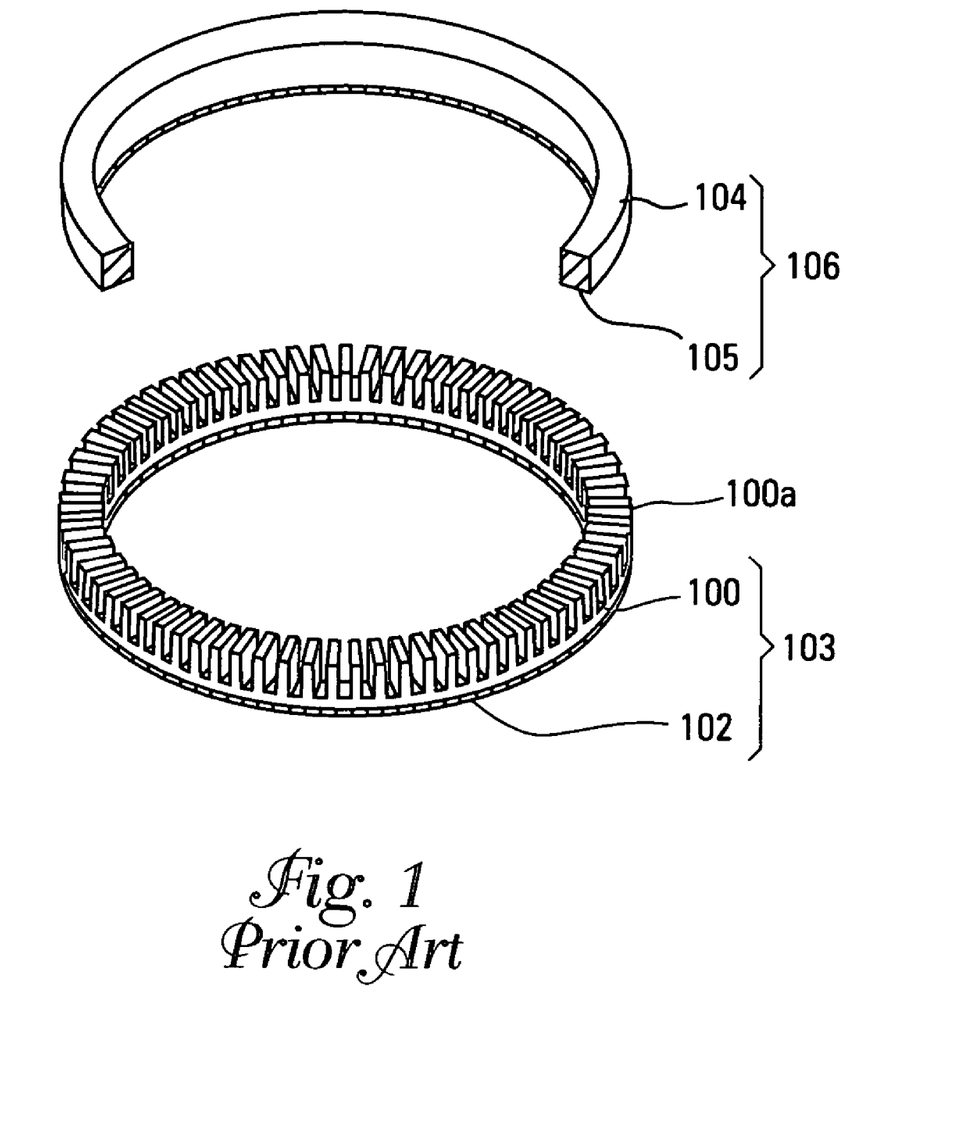
FIG. 1 is a representative example of a prior art ultrasonic motor.
Figure 2:
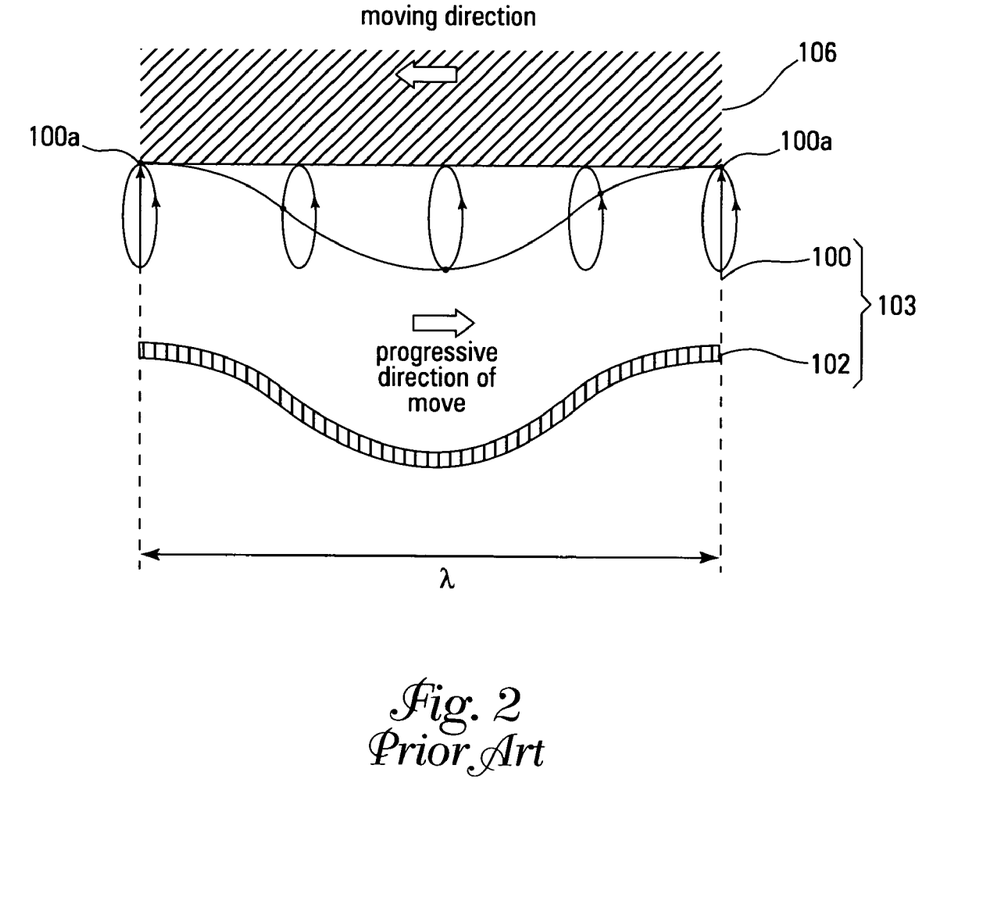
FIG. 2 illustrates the operation of the prior art ultrasonic motor of FIG. 1.

A representative example of a prior art ultrasonic motor is described with reference to FIGS. 1 and 2 and U.S. Pat. No. 5,448,129. FIG. 1 is a partially cut perspective view showing essential parts of a conventional ring-shaped ultrasonic motor. A reference numeral 103 denotes a vibrating body comprised of a ring-shaped elastic base 100 with plural projections 100a and a ring-shaped piezoelectric element 102 attached to the bottom surface of the elastic body 100. A reference numeral 106 denotes a moving body, which is comprised of a ring-shaped elastic body 104 with an abrasion resistant friction member 105 attached thereto. In this example of a conventional ultrasonic motor, steel or a stainless steel is usually used for the materials of the elastic body 104, and the friction member 105 is bonded thereto with an adhesive or other means.

The operation of the conventional ring-shaped ultrasonic motor thus comprised is described below with reference to FIG. 2, which shows that the moving body 106 and vibrating body 103 are held in pressure contact, and a progressive wave of flexural vibration is excited in the vibrating body 103. The progressive wave of flexural vibration is generated as follows. At first, a longitudinal vibration is caused in the piezoelectric element 102 by applying two AC voltages with a predetermined phase shift to two sets of driving electrodes arranged thereon. Since the elastic base 100 works to resist this longitudinal action, a progressive wave of flexural vibration is set up in the vibrating body 103. Any given point on the surface of the vibrating body 103 follows an elliptical motion due to the progressive wave of flexural vibration. The projections 100a enlarge the lateral displacement of this elliptical motion. The moving body 106, pressed in friction contact with projections 100a of the vibrating body 103, is rotationally driven due to the enlarged lateral displacement.

Prior art ultrasonic vibration motors use relatively complicated means of friction coupling a vibration source to the moving body. For the reasons stated above, and for other reasons stated below which will become apparent to those skilled in the art upon reading and understanding the present specification, there is a need in the art for an improved vibration driven motor.

SUMMARY OF THE INVENTION

The above-mentioned problems with motors and other problems are addressed by the present invention and will be understood by reading and studying the following specification.

In one embodiment, a motor includes a resonator and a piezoelectric source coupled to the resonator. A drive shaft is coupled to the resonator via a linkage. The piezoelectric sources impart a vibration along the resonator such that a lateral displacement of the resonator is focused at a location coupled to the linkage. The lateral displacement is coupled to the drive shaft to provide rotational motion of the drive shaft.

A method of operating a motor comprises generating a vibration in a resonator member, focusing the vibration to provide focused lateral displacement of the resonator at a location along the resonator, coupling the resonator to a drive shaft via a linkage coupled to the resonator at the focused location, and converting the lateral displacement to a rotational displacement of the drive shaft.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Embodiments of the present invention use a vibration source that is mechanically coupled to a motor shaft for generating rotational motion. One or more actuators focus energy via a vibrating member, or resonator, to move a drive shaft. The actuators can be piezoelectric patches or discrete piezoelectric components, such magnetic, hydraulic, shape memory alloy, step motors, or conventional shakers.

Ultrasonic motors use traveling waves to induce motion along an axis, are based on the injection of impulsive signals, and operate at high frequencies. Thus, high frequency and high energy impulsive signals are needed to excite the axial traveling modes of a structure. Further, motion is translated by friction interfaces (two sub elements connected via friction). In contrast, the present invention is based on standing waves. Thus, a harmonic input is used to drive the system and not impulsive. Since the present motor embodiments operate based on standing waves, they operates at low frequency, from 0 to below ultrasonic. Axial, transverse and bending waves are excited. It is the transverse or bending waves that transfer the motion, and the axial waves are used to transfer the energy through out the structure. Finally, friction surfaces may not be needed. Motion can be transferred very much like the existing combustion engines, i.e., via fasteners and other means of connecting components.

Figure 3:
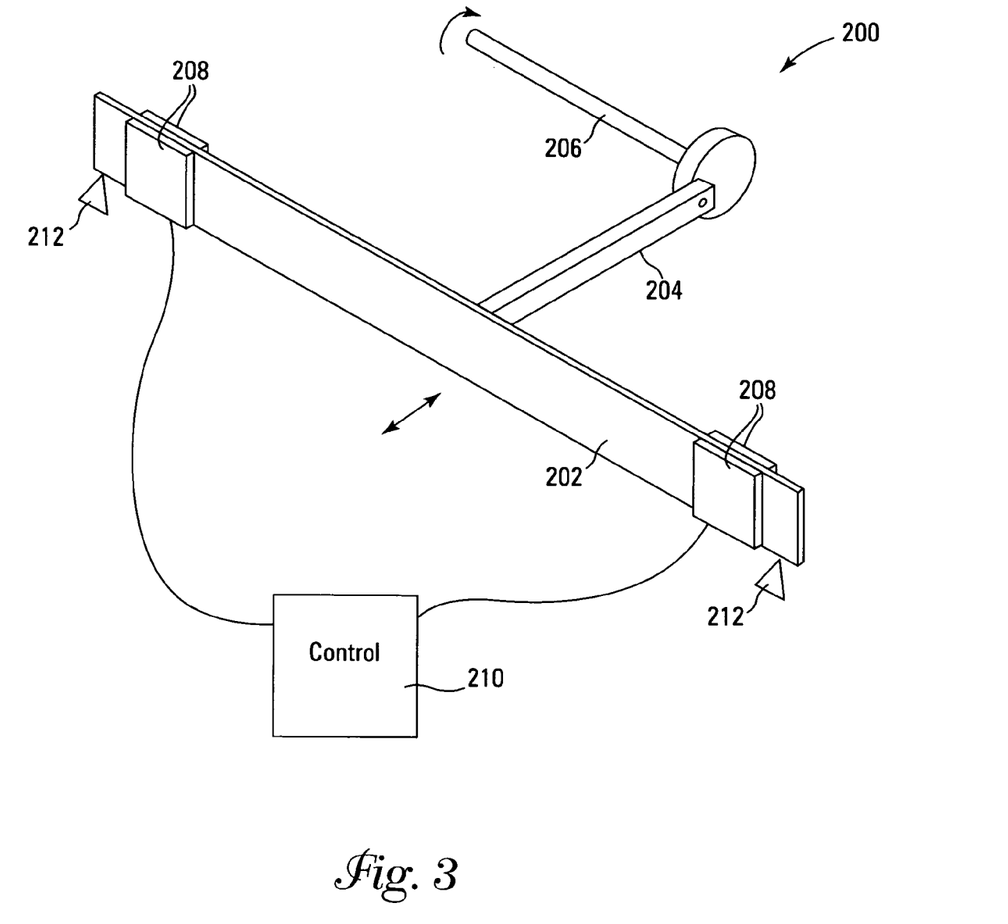
FIG. 3 is a simplified diagram of an embodiment of a vibration based motor of an embodiment of the present invention.

Referring to FIG. 3, a simplified diagram of an embodiment of a vibration based motor 200 of an embodiment of the present invention. The motor includes a resonator 202, a mechanical linkage 204, a drive shaft 206 and piezoelectric sources 208. A power control circuit 210 adjusts the voltage application to the piezoelectric sources 208. In addition, the control uses elements of the piezoelectric sources 208 as a feedback to measure the applied displacement of the resonator. The resonator is supported at the ends of the resonator (represented by triangles 212), or at other suitable locations based upon the vibration profile applied to the resonator.

In one embodiment, sources 208 are of a piezoelectric material, such as a formulation of lead, magnesium, and niobate (PMN), a formulation of lead, zirconate, and titanate (PZT), or the like. Resonator 202 can be fabricated from steel, plastic, ceramic, aluminum, urethane, rubber, or the like.

When an alternating voltage is applied to a piezoelectric material, such as source 208, the piezoelectric material alternately expands and contracts. When an alternately expanding and contracting piezoelectric material is attached to an object, such as resonator 202, the alternating expansions and contractions cause the object to vibrate. Conversely, when a vibrating object exerts an alternating force on a piezoelectric material, the piezoelectric material alternately expands and contracts, and the piezoelectric material produces an alternating voltage that is indicative of the vibration. In this manner, the piezoelectric material can be used as a sensor. These facts can be used to construct transducers having sensing capabilities. For example, a transducer can include adjacent piezoelectric portions, where one portion has leads used as an input for accepting an alternating voltage and the other portion has leads used as an output for outputting voltages indicative of vibrations.

Sources 208 are substantially rigidly attached, as shown, to resonator 202 by bolting, screwing, gluing, or the like. Hereinafter "substantially rigidly attached" will be referred to as "attached" and will include these methods of attachment and others recognized as suitable equivalents by those skilled in the art. The transducers apply lateral forces to the resonator. These forces may be amplified, as described below.

Figure 4:
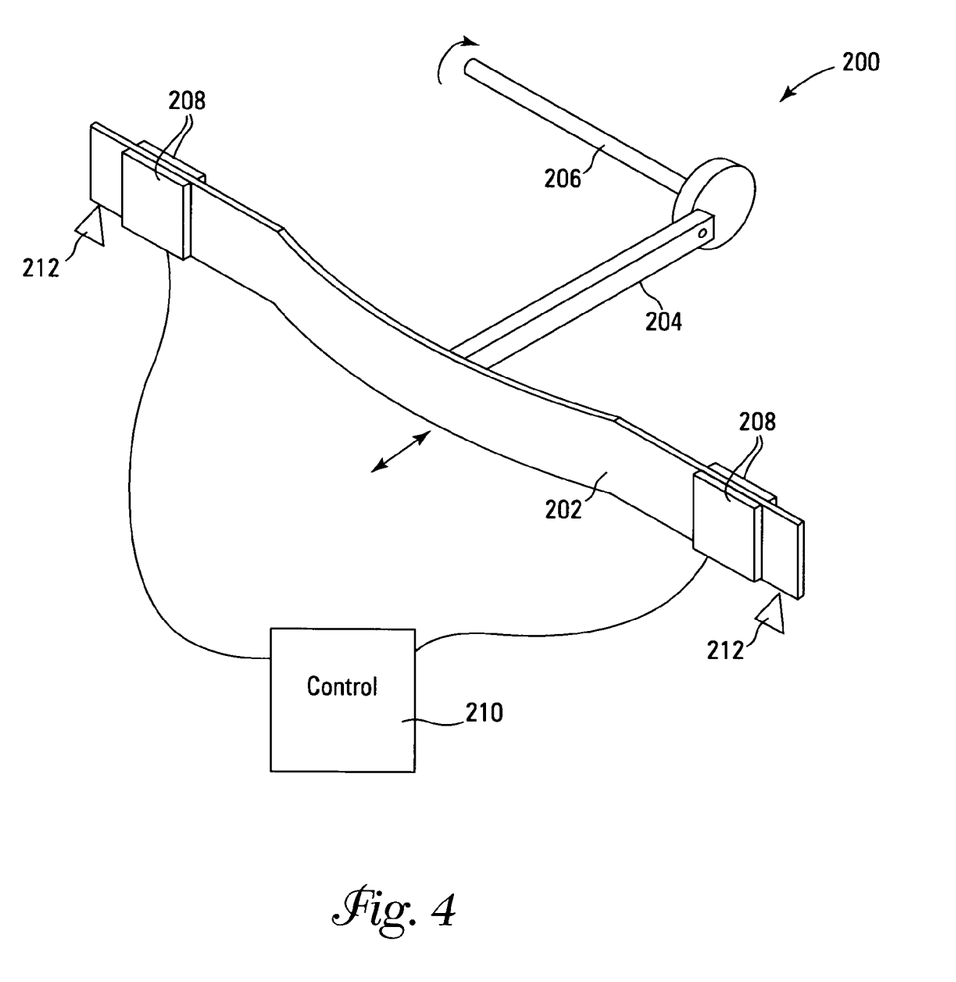
FIGS. 4 and 5 illustrate simplified single node vibration of the motor of FIG. 3.
Figure 5:
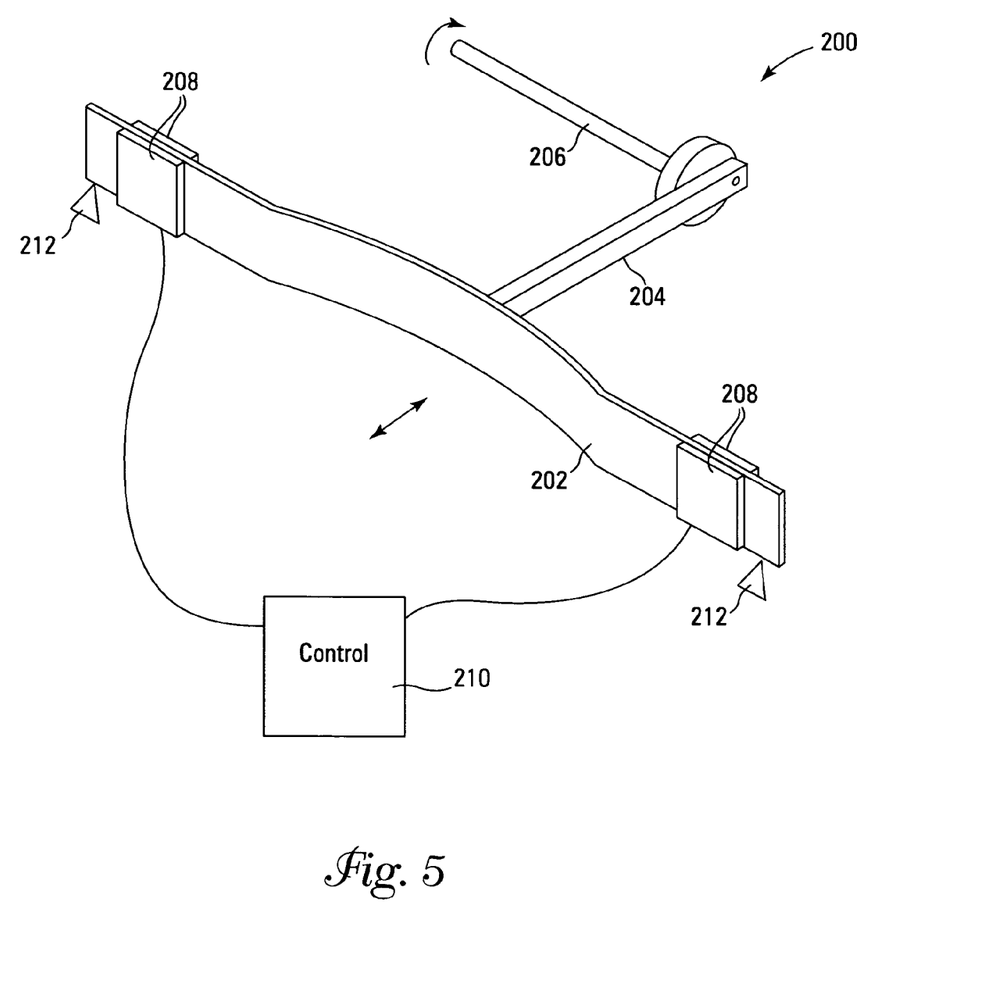

In operation, the piezoelectric sources are controlled to vibrate the resonator and generate a vibration profile. A simplified single node vibration is illustrated in FIGS. 4 and 5. The lateral displacement of the resonator is converted to rotational motion by the linkage 204 and the drive shaft 206.

Figure 6:
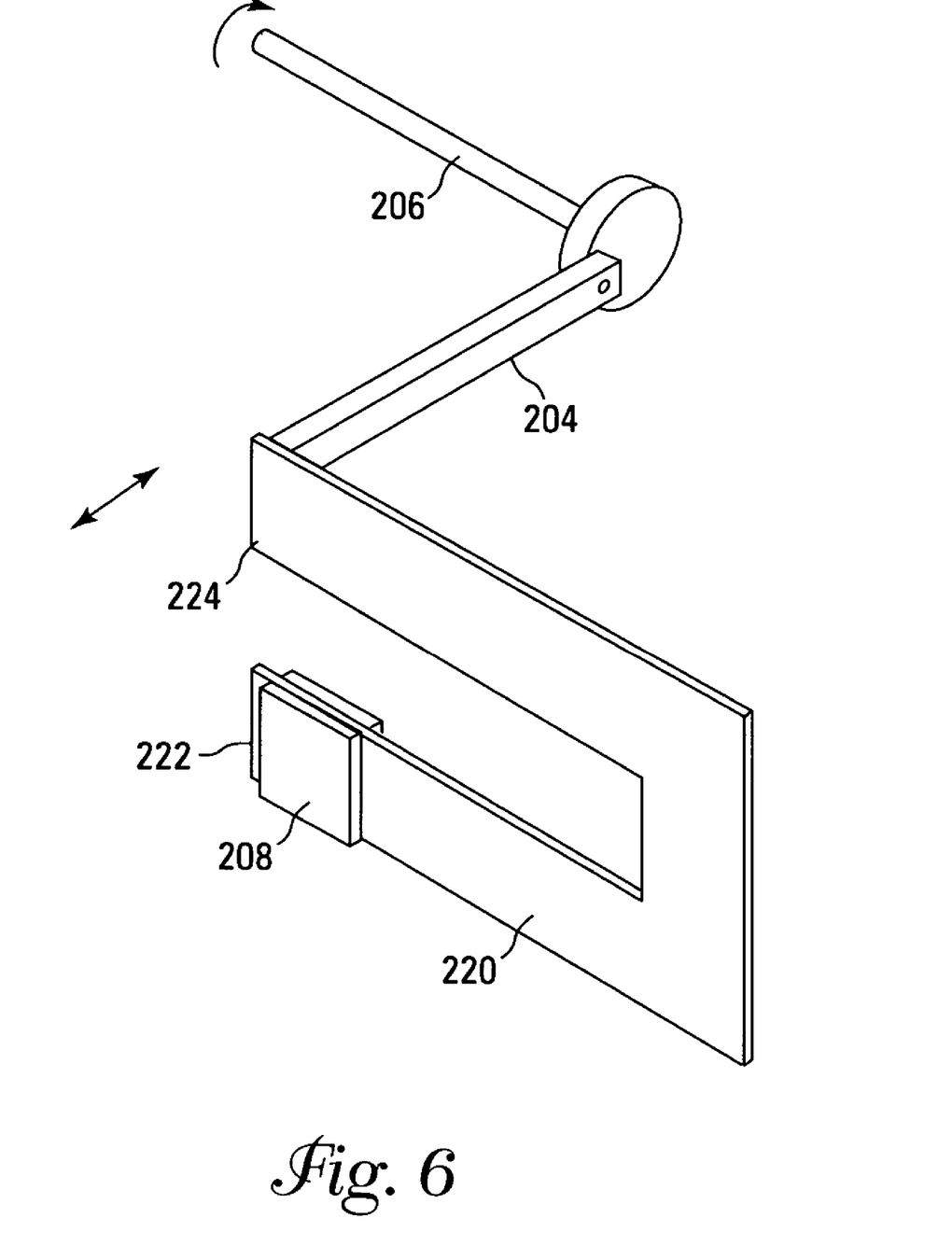
FIG. 6 illustrates an alternate embodiment of a resonator.

An alternate embodiment of a resonator 220 is illustrated in FIG. 6. The resonator includes a first end 222 where the piezoelectric sources are coupled and an amplifier end 224 that is coupled to the linkage. Resonator 220 amplifies the vibration (i.e., the displacement and the acceleration of the vibration) and transmits the amplified vibration to the drive shaft.

Figure 7:
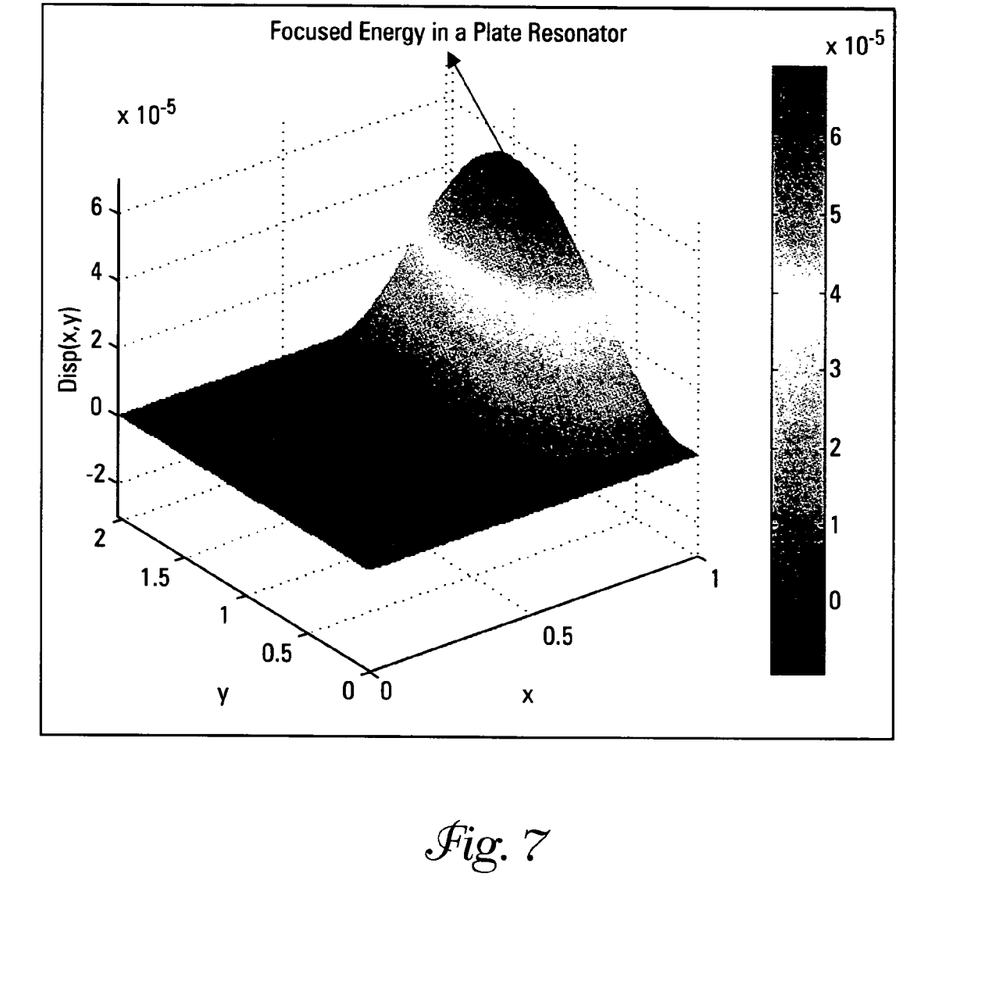
FIG. 7 illustrates the energy of a plate resonator where the energy has been focused to a specific location.

In another embodiment sources 208 are used to focus the energy at regions where it is more useful, thus making the system more efficient. The focused energy can be used directly or after amplification to move the drive shaft. Detailed descriptions of how energy can be diverted from one region and focused at another region are given in U.S. Pat. No. 6,116,389 entitled APPARATUS AND METHOD FOR CONFINEMENT AND DAMPING OF VIBRATION ENERGY issued on Sep. 12, 2000 and U.S. Pat. No. 6,032,552 entitled VIBRATION CONTROL BY CONFINEMENT OF VIBRATION ENERGY issued on Mar. 7, 2000, which are incorporated herein by reference. For example, a plate can be used in place of the beam resonator. FIG. 7 illustrates the energy of a plate resonator where the energy has been focused to a specific location. The location of the focused energy can be used to impart movement of the motor, similar to the above described embodiments.

Figure 8:
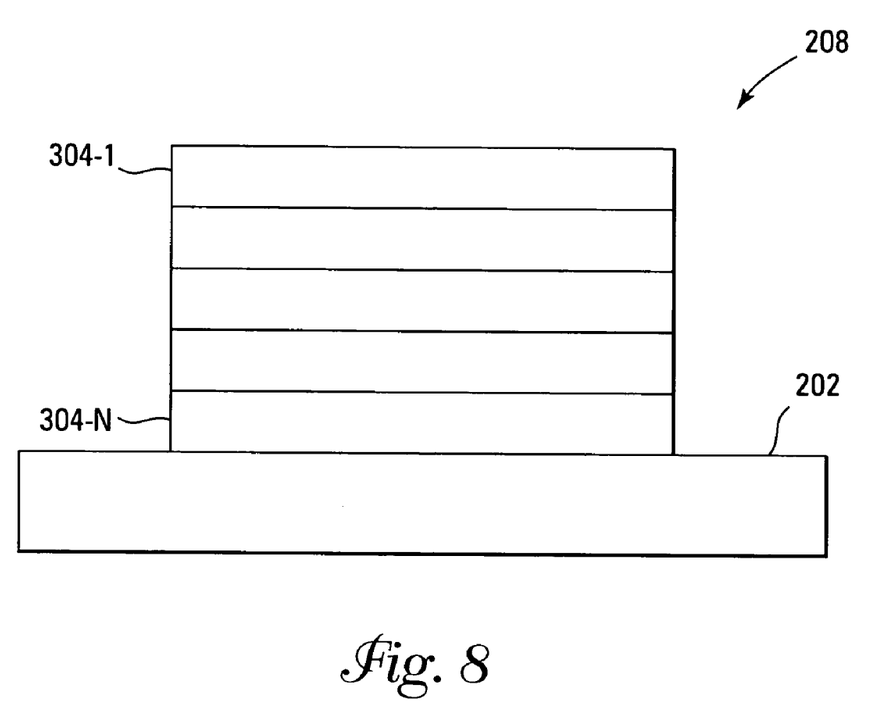
FIG. 8 illustrates a stacked embodiment of a piezoelectric source.

FIG. 8 illustrates a stacked embodiment of source 208 attached to a resonator 202. In this embodiment, source 208 comprises piezoelectric layers 304-1 through 304-N stacked one atop the other. Each of piezoelectric layers 304-1 through 304-N is a formulation of lead, magnesium, and niobate (PMN), a formulation of lead, zirconate, and titanate (PZT), or the like. In one embodiment, piezoelectric layers 304-1 through 304-N are electrically interconnected in parallel. Stacking of layers 304-1 through 304-N amplifies the vibration by multiplying the force or the vibration displacement by the number of layers. In one embodiment, one or more of layers 304-1 through 304-N can be used as a sensor. That is, piezoelectric elements can be used to provide motion in response to an applied voltage, or provide a voltage in response to physical changes.

Figure 9:
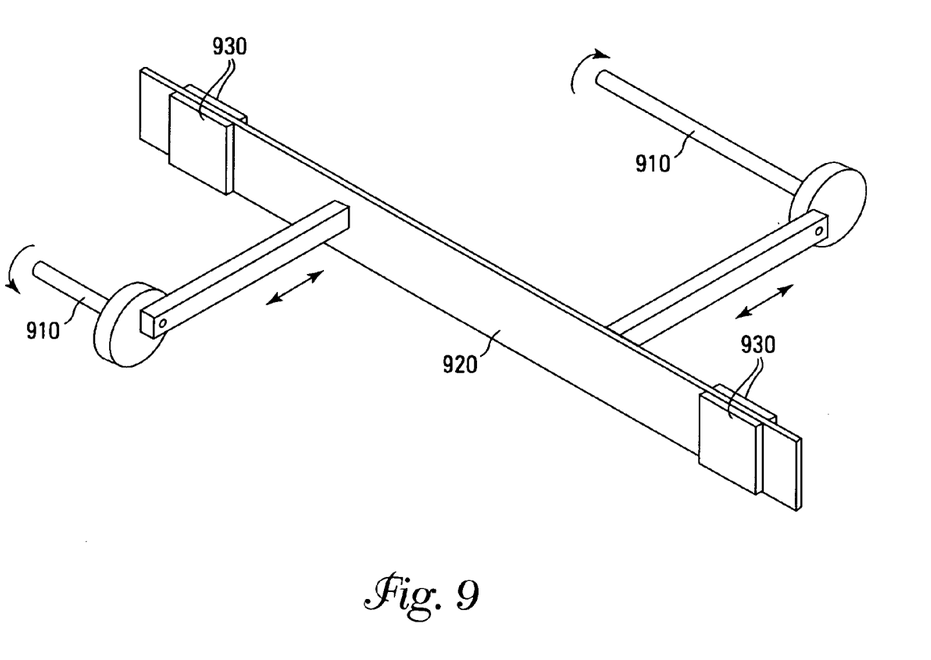
FIG. 9 is a simplified diagram of an alternate embodiment of a vibration based motor of an embodiment of the present invention.

The present invention has been described using simplified drawings to focus on the inventive concepts. It will be appreciated by those skilled in the art, with the benefit of the present description, that the motor can be configured in numerous different embodiments without departing from the invention. For example, the linkage and drive shaft are illustrated as basic rods, but will be adapted to the physical and mechanic parameters of a specific application when implemented in a real-world application. For example, gears or clutches may be used to couple the resonator to the drive shaft in place of a rigid linkage. As such, additional detail is not needed to understand or practice the present invention. Further, the piezoelectric sources can be controlled to vibrate the resonator to numerous different vibration profiles. For example, FIG. 9 illustrates an embodiment having two drive shafts 910 driven by one resonator 920. The piezoelectric sources 930 are controlled to focus the vibrations in two locations along the resonator. The first bending mode of a fixed-fixed beam resonator has only one peak in the middle. This maximum deflection area is called an anti-node. If there is one anti-node, it is called a first mode. The second mode has two anti-nodes, and 3rd mode will have three anti-node, and so on. For example, the image shown in FIG. 4 represents the first bending mode of the resonator. The embodiment shown in FIG. 9 can be used in conjunction with the second mode since the two connecting rods can be connected at the two anti nodes. It is noted that the two anti nodes of the second mode are 180 out of phase.

CONCLUSION

A motor has been described that includes a resonator and a piezoelectric source coupled to the resonator. A drive shaft is coupled to the resonator via a linkage. The piezoelectric sources impart a vibration along the resonator such that a lateral displacement of the resonator is focused at a location coupled to the linkage. The lateral displacement is coupled to the drive shaft to provide rotational motion of the drive shaft.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A motor comprising:
    a resonator;
    a piezoelectric source coupled to the resonator;
    a first drive shaft coupled to the resonator via a first linkage; and
    a second drive shaft coupled to the resonator via a second linkage, wherein the piezoelectric source imparts a vibration along the resonator such that lateral displacements of the resonator are focused at locations coupled to the first and second linkages, the lateral displacements are coupled to the first and second drive shafts to provide rotational motion of the drive shafts.

2. The motor of claim 1 wherein the resonator comprises an amplifier end coupled to the linkage.

3. The motor of claim 1 wherein the resonator is an elongated plate.

4. The motor of claim 3 wherein the piezoelectric source comprises a plurality of substantially flat plates attached to the resonator.

5. A motor comprising:
    a resonator;
    a vibration source coupled to the resonator;
    a first drive shaft coupled to the resonator via a first linkage; and
    a second drive shaft coupled to the resonator via a second linkage, wherein the vibration source imparts a vibration along the resonator such that lateral displacements of the resonator are focused at locations coupled to the first and second linkages, the lateral displacements are coupled to the first and second drive shafts to provide rotational motion of the drive shafts.

6. The motor of claim 5 wherein the vibration source is a piezoelectric device.

* * * * *